United States Patent [19]
Piatt et al.

[11] Patent Number: 4,991,287
[45] Date of Patent: Feb. 12, 1991

[54] METHOD FOR FABRICATING PRINTED CIRCUIT BOARDS

[75] Inventors: Michael J. Piatt, Enon; Mark E. Brown, West Carrollton; Michael A. Walters, Kettering, all of Ohio

[73] Assignee: Eastman Kodak Company, Rochester, N.Y.

[21] Appl. No.: 456,432

[22] Filed: Dec. 26, 1989

[51] Int. Cl.$^5$ .............................................. H05K 3/34
[52] U.S. Cl. ...................................... 29/840; 29/846; 118/697; 427/96
[58] Field of Search .......................... 427/96; 118/697; 29/840, 846, 847

[56] References Cited

U.S. PATENT DOCUMENTS

| 2,582,685 | 1/1952 | Eisler | 96/427 |
| 4,403,410 | 9/1983 | Robinson | 830/29 |

FOREIGN PATENT DOCUMENTS 3728337  3/1989  Fed. Rep. of Germany .

Primary Examiner—Carl E. Hall
Assistant Examiner—Carl J. Arbes
Attorney, Agent, or Firm—John D. Husser

[57] ABSTRACT

A process for fabricating a printed circuit board includes the steps of producing data in a printing-scan format representative of a designed area circuit pattern; with such data, printing a mask pattern, corresponding to said circuit pattern, on the metal surface of a dielectric substrate; and etching to remove unmasked portions of the metal layer.

3 Claims, 3 Drawing Sheets

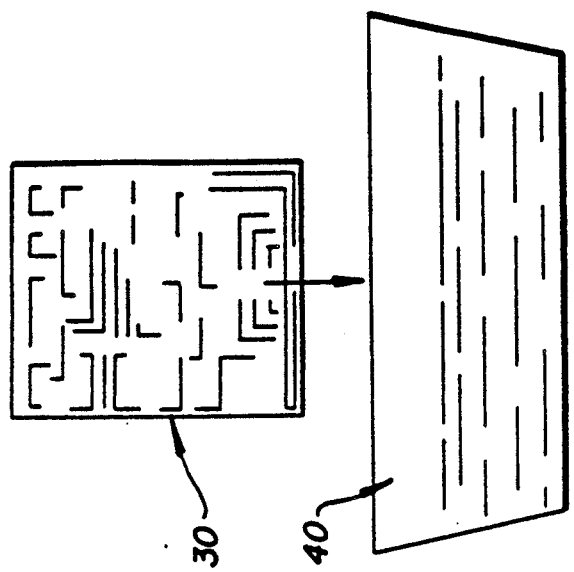
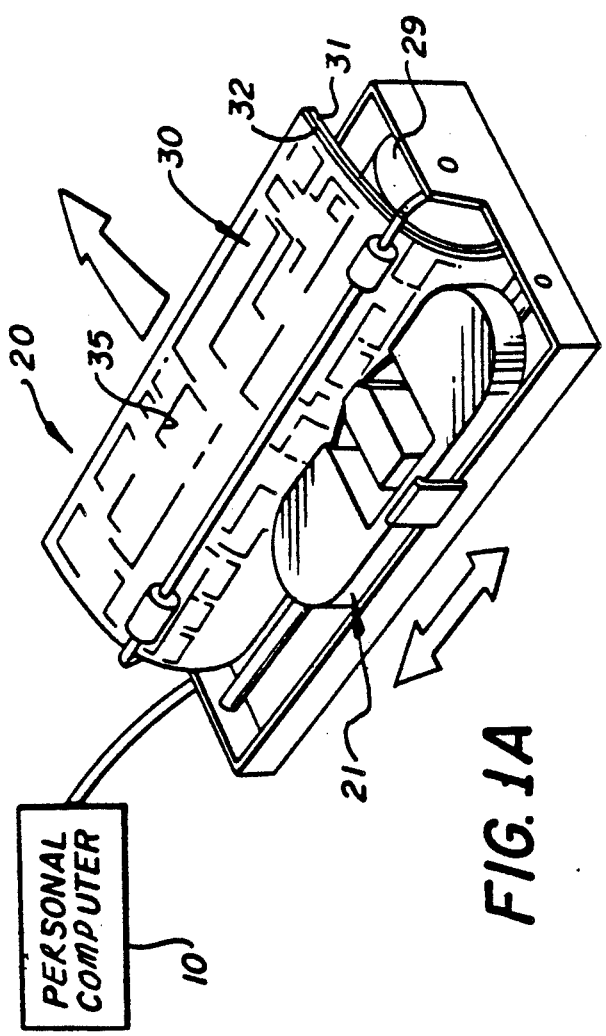
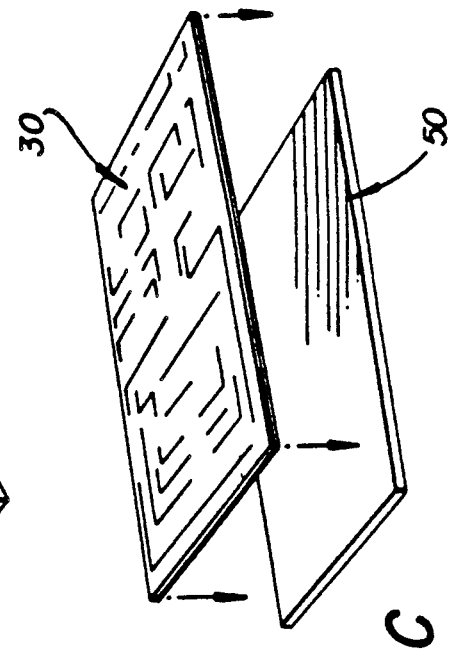

METHOD FOR FABRICATING PRINTED CIRCUIT BOARDS

FIELD OF THE INVENTION

The present invention relates to the fabrication of printed circuits and, more particularly to improved apparatus and procedures for the more direct printing of computer generated circuit designs.

BACKGROUND OF INVENTION

The use of printed circuit boards is mushrooming and significant improvements have been made in the procedures for creating the actual layouts for the printed circuits. For example, computer software packages are available, for CAD systems and personal computers, so that a circuit designer can input schematic circuit designs and general parameters (such as board size and lead thickness). In response to this input data the computer generates an efficient circuit board pattern, for the given parameters, and stores it, e.g. on magnetic media.

At this stage, however, the typical fabrication procedure often involves undesirable delays and costs. For example involves undesirable delays and costs. For example, the stored data, representing the computer designed circuit pattern, is forwarded to a different in-house group, or outside vendor, where it assumes its position in queue, to be converted to master artwork for subsequent photofabrication. After the required masks have been produced, they are forwarded to yet another group, often a separate vendor, to again queue for the actual board fabrication process. This final stage involves exposing the masks to form a photoresist pattern on a continuous metal layer, which is then etched to leave the metal layer pattern of the circuit. The residual photoresist mask is removed and the prototype circuit board is returned to the design originator so that it can be tried in tis intended system. If system problems arise, e.g. because of unforeseen problems with the original schematic circuit design, the entire sequence is begun again.

It will be appreciated from the foregoing that the development of acceptable printed circuit boards for new products is often a major difficulty encountered in trying to shorten new product development periods. One commercially available product for reducing long lead times for prototype circuits utilizes the output of CAD schematics to control a mechanical milling device to fabricate prototype circuits. However, this system is relatively expensive.

SUMMARY OF INVENTION

A significant purpose of the present invention is to provide improved processes and systems that reduce the above described obstacles to attaining fast access to newly-designed printed circuit boards. One important advantage of the process of the present invention is that it reduces the amount of the circuit board fabrication that needs to be passed away from the designer for special fabrication steps. Another important advantage of the present invention is that its fabrication process reduces cost of such printed circuit fabrication, as well as reducing the overall time period of the fabrication.

In one preferred embodiment, the present invention constitutes a process for fabricating a printed circuit board comprising the steps of: producing, in a memory device, data representative in a printing-scan format of a designed area circuit pattern; under the control of such data, printing a mask pattern, corresponding to the circuit pattern, onto the metal surface of a metal coated dielectric substrate; and etching the substrate to remove unmasked portions of the metal layer.

BRIEF DESCRIPTION OF DRAWINGS

The subsequent description of preferred embodiments of the invention refers to the accompanying drawings wherein:

FIGS. 1A–1C are schematic illustrations showing procedural steps of one preferred embodiment of the present invention;

DETAILED DESCRIPTION OF THE PREFERRED EMBODIMENTS

Figure 2:
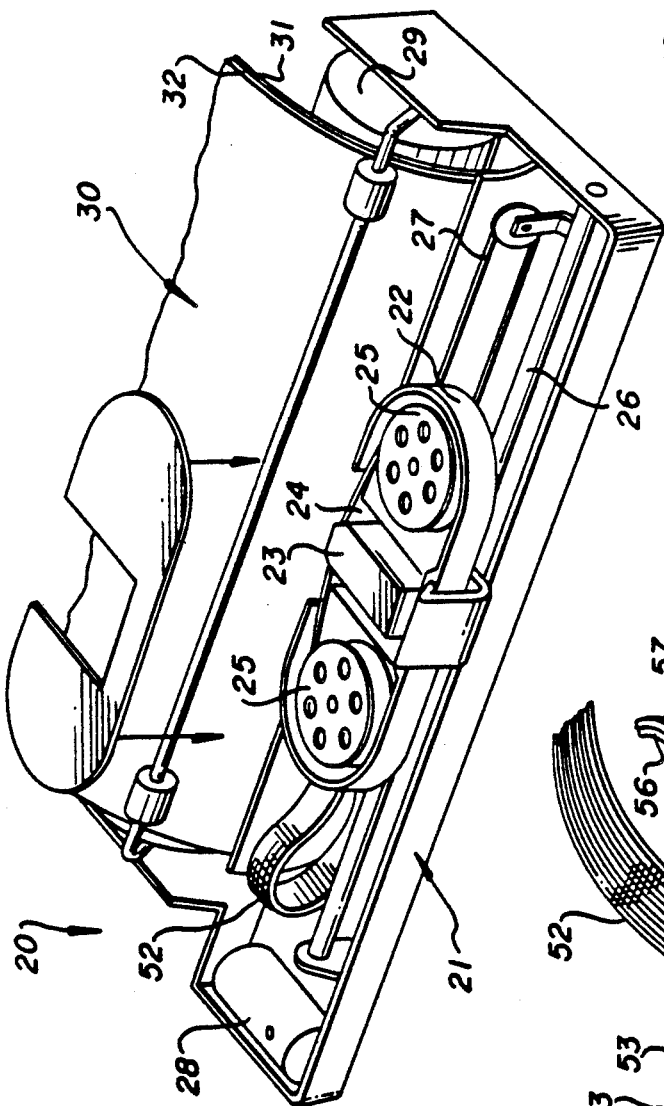
FIG. 2 is a perspective view of one preferred printer apparatus for use in accord with the present invention.

FIG. 1A–1C show schematically the steps of one preferred method of the present invention. Thus, one of a number of commercially available personal computers 10, under the control of a software program is provided to produce and store data representative, is raster scan format, of a designed printed circuit pattern. Representative personal computer-based programs to perform such functions are "Tango Plus", Accel Technologies, Inc., San Diego, Calif.; "Criterion", APTOS Systems corp, Aptos, Calif.; "PADS", CAD Software, Littleton, Mass.; "DC/CAD IV", Design Computation, Inc., Farmingdale, N.J.; "Schema-PCB", Omation, Inc., Richardson, Tex. and "Vangard", Teledyne, Inc., Santa Clara, Calif. The product packages perform autorouting functions that output circuit design patterns to standard peripheral printers in response to raster or vector data input.

In accord with the present invention, circuit pattern printer 20 is coupled to receive the output data from the computer 10 and comprise, in general, a traversing print head and carriage assembly 21, a transport platen 29 and motor and drive systems for effecting synchronized movement of those components under a printer control. As will be described subsequently in more detail, the printer 20 is constructed to receive and feed a flexible composite sheet 30 comprising a dielectric layer 31, e.g. of polyamide film, bearing a continuous metal layer 32, preferably a copper layer. Under the control of computer 10, the print head of assembly 21 produces a mask pattern 35, corresponding to the designed printed circuit, on the metal layer of sheet 30 as successive line portions are fed sequentially by the platen 29 past the linear print zone of the print head traverse.

As illustrated by FIG. 1B, when the sheet has been advanced through the circuit printer 20 and the mask pattern corresponding to the entire circuit pattern has been printed on its metal layer 32, the sheet is removed and placed in an acid etch solution 40, e.g. FeCl$_3$, for a time period sufficient to allow the non-masked portion of the metal layer to be removed. The sheet is then rinsed and dried and, as illustrated by FIG. 1C, attached by suitable adhesive to a board 50 to form a circuit board with the designed circuit lead pattern.

Figure 3:
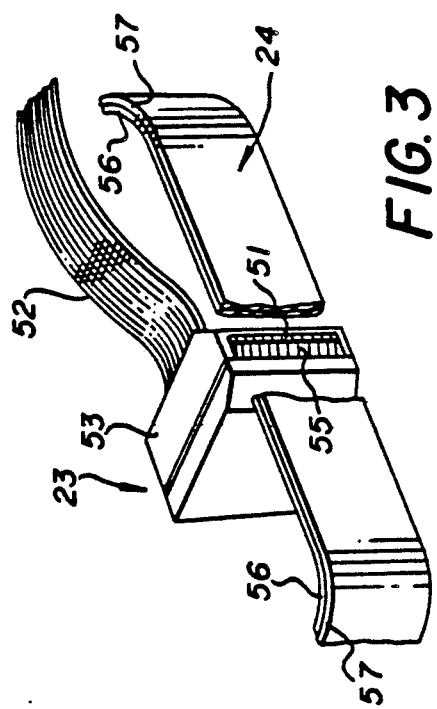
FIG. 3 is an enlarged perspective view of a portion of the FIG. 2 printer.

The preferred circuit printer 20 is shown in more detail in FIG. 2, and it can be seen that the print head-carriage assembly 21 includes a housing 22 which mounts print head 23, print media 24 and supply and take-up reels 25 for traverse along shaft 26, when driven by cable 27 and motor 28. As best seen in FIG. 3, the print head 23 has a plurality of resistive heater elements 51 formed on a surface facing the print media strip 24. A flex cable 52 supplies electrical power to a circuit within the print head body 53 and the print head circuit selectively activates different resistive heater elements via their separate leads 55, to cause selective heating of adjacent portions of the print media.

FIG. 3 also illustrates a preferred print media 24 of the present invention that comprises a plastic support strip 56 bearing a continuous solder layer 57. The solder layer 57 of strip 24 confronts the copper layer 32 of composite sheet 30 and the plastic support confronts the array of heaters 51. As the print head and carriage assembly is traversed across the print zone, a gear system (not shown) in the bottom of the housing 22 converts the traverse carriage motion to a synchronized rotary drive of take up reel 25 so that fresh sections of the strip 24 are indexed in front of the heater array at each successive traverse printing position.

Figure 4:
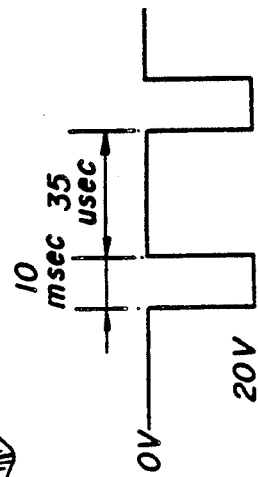
FIG. 4 is a diagram illustrating a printer duty cycle useful in accord with the present invention.

Under the control of the printer control system, and in response to the raster format data from computer 10, the heater elements 51, of the print head array are selectively energized at each transverse position along the transverse path. FIG. 4 shows one preferred duty cycle for such heater elements wherein a 20 V energy pulse is applied for a period of 10 M sec. Such energization causes those heaters which are addressed at any given position to melt the solder that is on the plastic position opposing it, and the corresponding solder pixel transfers to the confronting portion of the metal layer 30. When a line printing is completed the carriage assembly returns to the line start position and the composite sheet is indexed an amount equal to the length of the print head heater array to commence the next line printing, in accord with the next portion of the raster format circuit design data stored in computer 10. When the entire sheet has been printed with the solder circuit pattern, it is processed as discussed above with respect to FIGS. 1B and 1C.

While various meltable materials are useful to transfer from the support 56 to contaminate the etching of covered portions of the metal layer 30, we have found that the use of solder mask material is highly advantageous. Thus, when appropriate solder materials are utilized, and transferred in controlled thickness, the pattern mask can serve as the electrical bonding media so that surface mounted components can be properly coupled to the circuit pattern with a simple placement and heating procedure. Even when separate bonding materials are required to attach components, the use of solder mask materials eliminates the need to remove the mask material.

Preferred solder materials are ones that melt and wick onto the copper surface in response to heat supplied by the print head during its energization in the above-described duty cycle of actuation.

Preferred exemplary solder materials are the following products of Indium Corporation of America, Utica, N.Y.:

| Indalloy No. | Composition | Melting Point (°F.) |
|---|---|---|
| 8 | 44 In, 42 Sn, 14 Cd | 200 |
| 257 | 52 Bi, 32 Pb, 16 Sn | 204 |
| 1E | 52 In, 48 Sn | 244 |
| 1 | 50 In, 50 Sn | 257 |

In accord with the present invention such solder materials are deposited, e.g. by vapor deposition or casting onto a support web such as Mylar ® and the composite structure is slit to form strip rolls that are assembled onto reels 25.

Figure 5A:
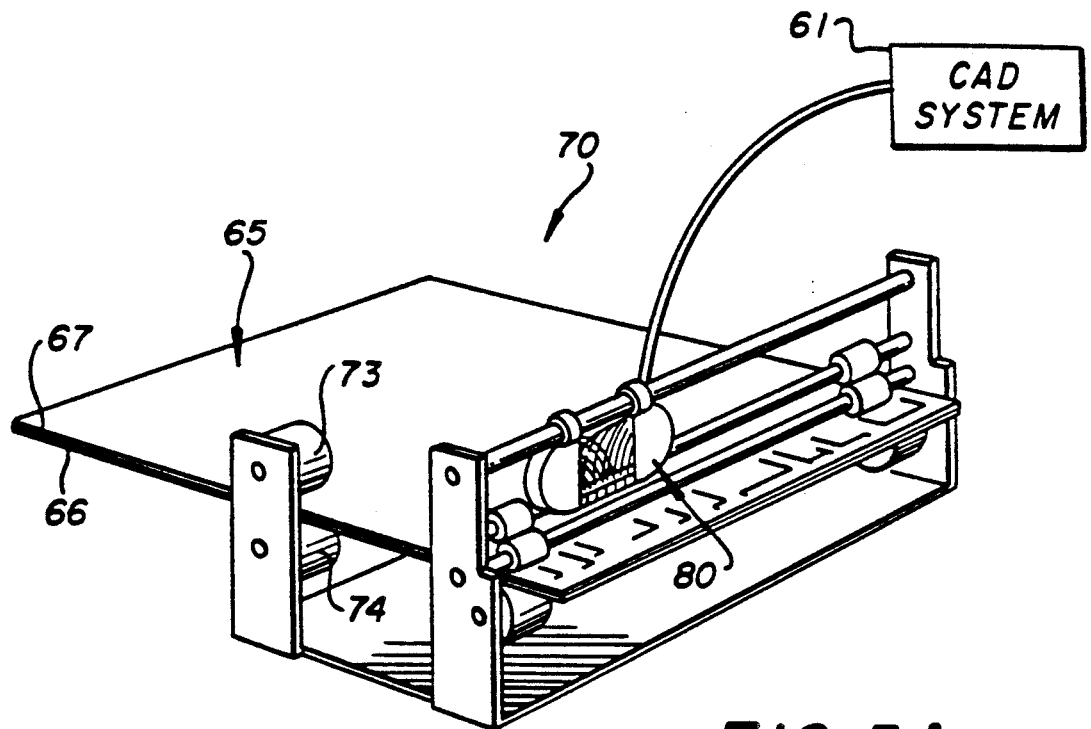
FIGS. 5A and 5B are schematic illustrations of the procedural steps of another preferred embodiment of the present invention.
Figure 5B:
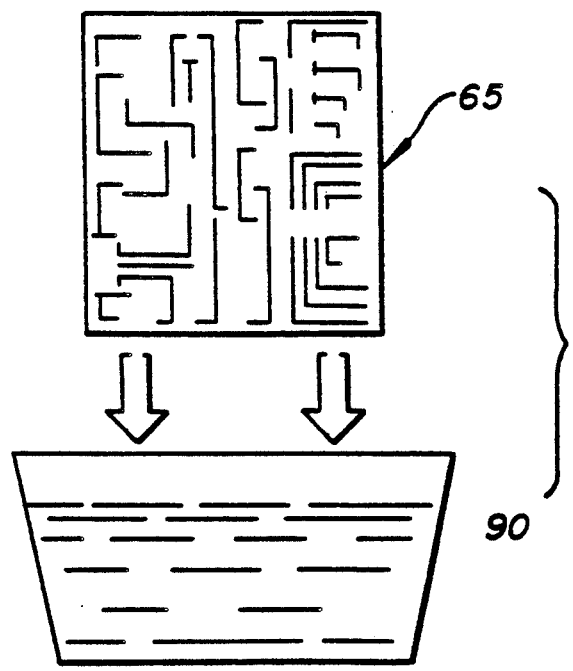

FIGS. 5A and 5B schematically illustrate another preferred embodiment of the invention. In this embodiment, data corresponding to a desired circuit lead pattern is computed and stored in CAD system 61, in a vector scan format suitable for use with the circuit printer 70. In this system, the circuit pattern is printed upon an element 65 comprising dielectric board 66 and a metal layer 67. The circuit printer 70 functions in a manner similar to a plotter device, with planar element 65 being driven back and forth through the print zone by drive rollers 73, 74, in computer controlled synchronization with the traverse of print head carriage assembly 80. The assembly 70 can comprise components like those shown in FIGS. 2 and 3, and its print head is actuated in proper synchronization with the vector format data output from the CAD system 61. When a solder circuit pattern has been completely printed on the metal layer 67 the board is exposed to an acid etch bath 90 rinsed and dried. It is then ready for operative placement of any chip components that comprise the overall circuit, which in some applications can be coupled by the advantageously simple steps of placement and heating.

The invention has been described in detail with particular reference to certain preferred embodiments thereof, but it will be understood that variations and modifications can be effected within the spirit and scope of the invention.

We claim:

1. A process for fabricating a printed circuit board comprising the steps of:
    (a) producing, in a memory device, data representative in a raster-scan printing format of a designed area circuit pattern;
    (b) under the control of such data, printing a mask pattern, corresponding to said circuit pattern, onto the metal surface of a metal coated dielectric substrate by:
        (1) feeding said sheet on a print platen so that successive lines of its metal surface pass through a print zone;
        (2) traversing a thermal print head across the print zone to address successive lines of the metal surface then at the print zone;
        (3) supplying a solder coated support ribbon between the print head and said substrate so that the solder contacts such metal surface; and
        (4) energizing the thermal print head during each traverse in accord with the raster-scan data whereby solder is transferred onto said metal surface selectively to form said mask pattern; and
    (c) etching said substrate to remove unmasked portions of said metal layer.

2. A process for fabricating a printed circuit board comprising the steps of:
   (a) producing, in a memory device, data representative in a vector-scan printing format of a designed area circuit pattern;
   (b) under the control of such data, printing a mask pattern, corresponding to said circuit pattern, onto the metal surface of a planar circuit board comprising a metal coated dielectric substrate by:
      (1) moving said board on a first axis so that portions orthogonal to that axis pass under a print zone;
      (2) traversing a thermal print head on a second axis parallel to the surface of said circuit board and perpendicular to said first axis;
      (3) supplying a solder coated support ribbon between the print head and said substrate so that the solder contacts such metal surface; and
      (4) energizing the print head in synchronized relation with traverse and orthogonal movements in accord with the vector-scan data whereby solder is transferred to said metal surface to form said mask pattern; and
   (c) etching said substrate to remove unmasked portions of said metal layer.

3. A process for fabricating a printed circuit board comprising the steps of:
   (a) producing, in a memory device, data representative in a printing-scan format of a designed area circuit pattern;
   (b) under the control of such data, printing a mask pattern, corresponding to said circuit pattern, onto the surface of a metal layer coated on a dielectric substrate;
   (c) etching said substrate to remove unmasked portions of said metal;
   (d) placing circuit components at predetermined locations on the printed mask pattern overlying non-removed metal layer regions; and
   (e) heating said mask pattern to couple said components to said non-removed metal layer regions.

* * * * *